United States Patent
Noda et al.

(10) Patent No.: US 6,657,735 B2
(45) Date of Patent: Dec. 2, 2003

(54) METHOD OF EVALUATING CRITICAL LOCATIONS ON A SEMICONDUCTOR APPARATUS PATTERN

(75) Inventors: Tomonobu Noda, Yokohama (JP); Tatsuo Akiyama, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 124 days.

(21) Appl. No.: 09/931,091

(22) Filed: Aug. 17, 2001

(65) Prior Publication Data

US 2002/0030187 A1 Mar. 14, 2002

(30) Foreign Application Priority Data

Sep. 12, 2000 (JP) .......................... 2000-277125

(51) Int. Cl.[7] .............................. G01B 11/14
(52) U.S. Cl. ................. 356/614; 356/237.2; 356/237.4; 356/237.5
(58) Field of Search .................. 356/614, 237.2, 356/237.7, 237.5, 600, 604

(56) References Cited

U.S. PATENT DOCUMENTS

| | | | |
|---|---|---|---|
| 5,173,719 A | * 12/1992 | Taniguchi et al. | 356/394 |
| 5,379,348 A | * 1/1995 | Watanabe et al. | 382/144 |
| 5,828,457 A | * 10/1998 | Tabata et al. | 356/394 |
| 5,995,219 A | * 11/1999 | Tabata | 356/237.5 |
| 6,452,677 B1 | * 9/2002 | Do et al. | 356/394 |

FOREIGN PATENT DOCUMENTS

| | | |
|---|---|---|
| JP | 6-12249 | 2/1994 |
| JP | 11-74326 | 3/1999 |
| JP | 11-220774 | 8/1999 |
| JP | 2000-261411 | 9/2000 |

OTHER PUBLICATIONS

U.S. patent application Ser. No. 09/931,091, Noda et al., filed Aug. 17, 2001.
U.S. patent application Ser. No. 10/327,114, Sato et al., filed Dec. 24, 2002.

* cited by examiner

Primary Examiner—Frank G. Font
Assistant Examiner—Roy M. Punnoose
(74) Attorney, Agent, or Firm—Oblon, Spivak, McClelland, Maier & Neustadt, P.C.

(57) ABSTRACT

Critical location information is used for providing a critical location evaluation method for a semiconductor apparatus pattern. The critical location information includes coordinate information about the critical location and characteristic information indicating a thinning direction and a magnitude thereof at the critical location. Use of this evaluation method can accurately evaluate specification and analysis of thinning or a pattern which makes it difficult to pinpoint a critical location through the visual inspection.

9 Claims, 3 Drawing Sheets

METHOD OF EVALUATING CRITICAL LOCATIONS ON A SEMICONDUCTOR APPARATUS PATTERN

CROSS-REFERENCE TO RELATED APPLICATIONS

This application is based upon and claims the benefit of priority from the prior Japanese Patent Application No. 2000-277125, filed Sep. 12, 2000, the entire contents of which are incorporated herein by reference.

BACKGROUND OF THE INVENTION

1. Field of the Invention

The present invention relates to a semiconductor apparatus pattern and more particularly to a method of effectively inspecting and evaluating critical locations on a semiconductor apparatus pattern especially having partially thick or thin shapes.

2. Description of the Related Art

Locating and analyzing a semiconductor apparatus pattern defect needs information (defect information) such as a defect coordinate obtained from a defect inspection apparatus and the like. One coordinate is given to one defect. During defect analysis, the defect inspection apparatus is supplied with a pattern and a corresponding defect coordinate. A defect is retrieved on the pattern based on the defect coordinate.

A general defect is easily located because it causes an abnormal state differing from adjacent pattern portions such as pattern opening or short-circuiting, particles, and the like. In the case of general defects, it is possible to easily obtain a defect image and measure the dimensions. Consequently, the defect can be easily analyzed.

However, there arises a problem in the case of partial thickening or thinning, shortening with only one end of a pattern shortened, and the like. Even if the sample is searched based on the defect coordinate, it is difficult to visually locate and analyze a critical location except in extreme cases.

Unlike an abnormal defect such as pattern opening or short-circuiting, and the like, the critical location is not easily determined whether as a defect until sandwiching wiring layers are actually formed.

As mentioned above, partial thickening or thinning, shortening with only one end of a pattern shortened, and the like cause the problem that it is impossible to easily pinpoint the critical location even if a defect is searched based on the defect coordinate (defect information).

BRIEF SUMMARY OF THE INVENTION

According to the present invention, there is provided a critical location evaluation method for a semiconductor apparatus pattern, comprising: comparing first pattern data corresponding to no critical location with second pattern data corresponding to a critical location with respect to the same semiconductor apparatus pattern; and extracting a difference between the first pattern data and the second pattern data as information indicating a characteristic of the critical location, with respect to a location causing the difference.

DETAILED DESCRIPTION OF THE INVENTION

Embodiments of the present invention will be described in further detail with reference to the accompanying drawings.

First Embodiment

Figure 1:
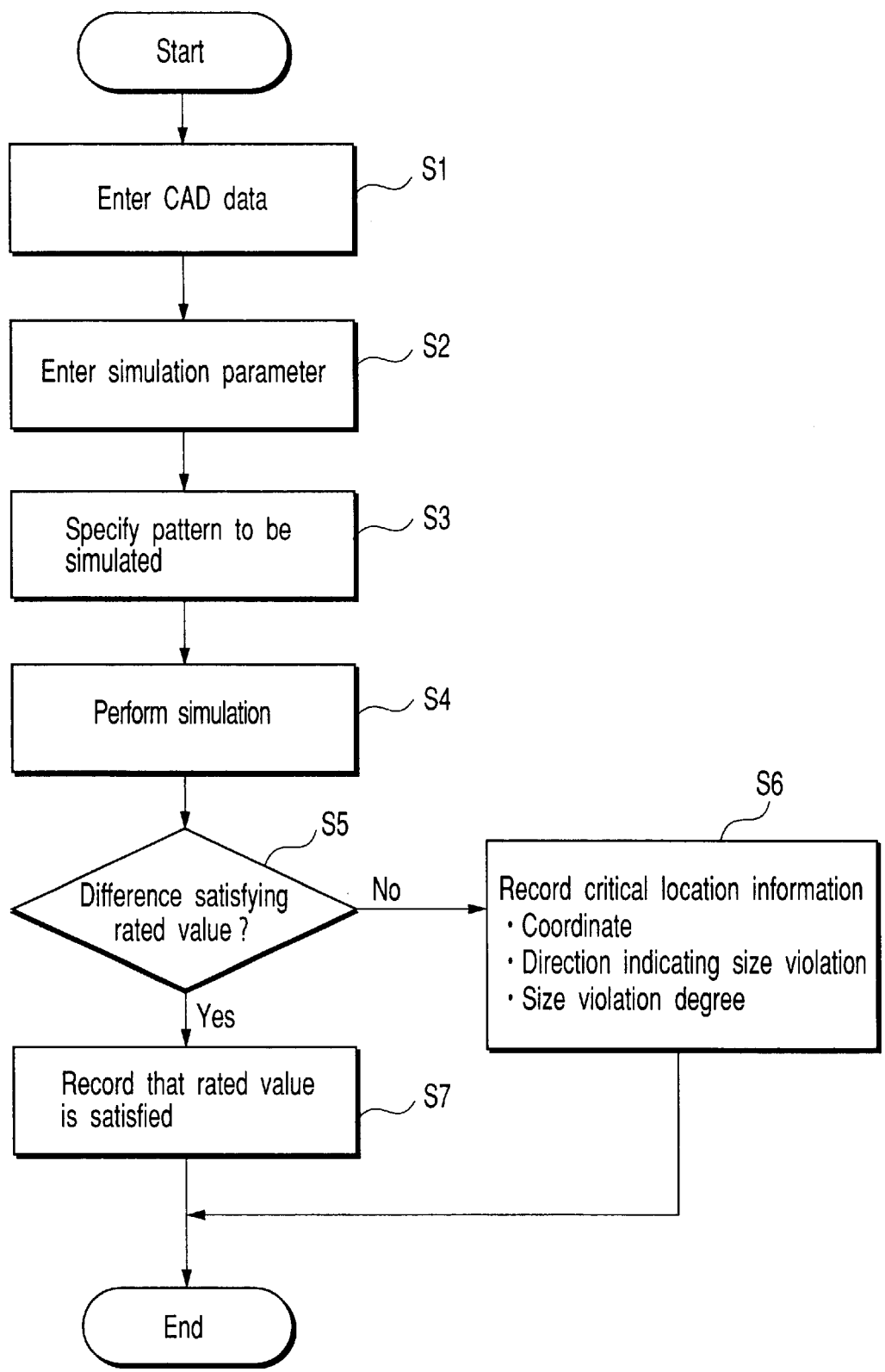
FIG. 1 is a flowchart showing a method of generating critical location information according to an embodiment of the present invention.

FIG. 1 is a flowchart showing a method of generating critical location information according to an embodiment of the present invention. The flowchart comprises steps S1 to S7.

A wiring pattern having a partially thickening or thinning shape is one of the patterns which make inspection using a defect inspection apparatus difficult. This embodiment simulates a shape in order to obtain information about a critical location (critical location information) on such a pattern. For doing so, a simulator is supplied with CAD data (first pattern data) for a device to be inspected and a simulation parameter for simulating an approximately actual shape (steps S1 and S2). This CAD data corresponds to an ideal pattern shape. The CAD data and the simulation parameter can be input in reverse order or at the same time.

Then, a pattern to be simulated is specified (step S3). The simulation is performed thereafter (step S4).

The CAD data (first pattern data) is compared with simulation pattern data (second pattern data) generated by the simulation to find a difference between the size of a pattern (simulation pattern) corresponding to the simulation pattern data and the size of an ideal pattern (CAD pattern) corresponding to the CAD data. It is then determined whether the difference satisfies a rated value, namely a rated size difference (step S5).

When the size difference between the simulation pattern and the CAD pattern exceeds the rated value, the process records identification information, coordinate information, and first and second characteristic information as the critical location information (step S6). The identification information is a number for distinguishing the relevant CAD pattern from the others. The coordinate information is a coordinate position indicating the critical location which causes the size difference to exceed the rated value. The first characteristic information indicates how much the simulation pattern deviates from the CAD pattern (size violation degree). The second characteristic information indicates a direction of the simulation pattern from the CAD pattern.

When the size difference between the simulation pattern and the CAD pattern satisfies the rated value, the process records that the pattern is formed correctly (step S7) to terminate the simulation.

In addition to the coordinate information about the critical location, the critical location information generated by this method includes characteristic information indicating characteristics of the critical location such as the size violation degree and the direction indicating the size violation. The characteristic information can be visualized. Accordingly, use of the critical location information can easily and visually specify or analyze a wiring pattern having a critical location such as shortening which is detected with difficulty through visual inspection. Use of this critical location information makes it possible to perform evaluation methods such as the pattern shape monitoring (fixed point monitoring) in manufacturing processes, the critical location analysis of patterns, the critical location correction, and the like more effectively than the prior art.

Figure 2:
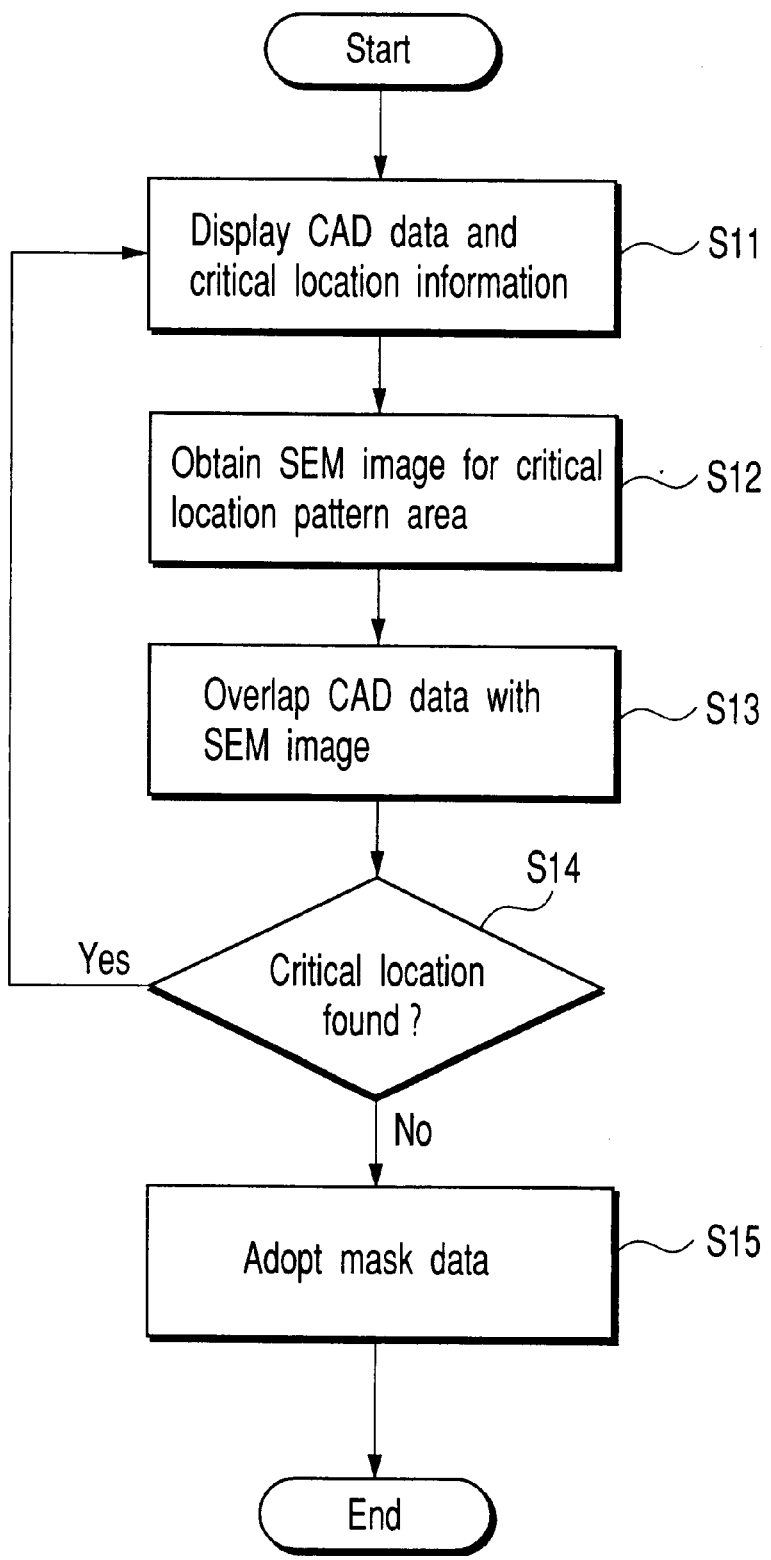
FIG. 2 is a flowchart showing a method of correcting a critical location on a pattern according to an embodiment of the present invention.

FIG. 2 is a flowchart showing a method of correcting a critical location on a pattern. The flowchart comprises steps S11 to S15. The critical location information on the pattern is predetermined by the above-mentioned method of creating the critical location information. Described below is the case of a pattern shape such as thinning of a wiring pattern and the like.

Figure 3:
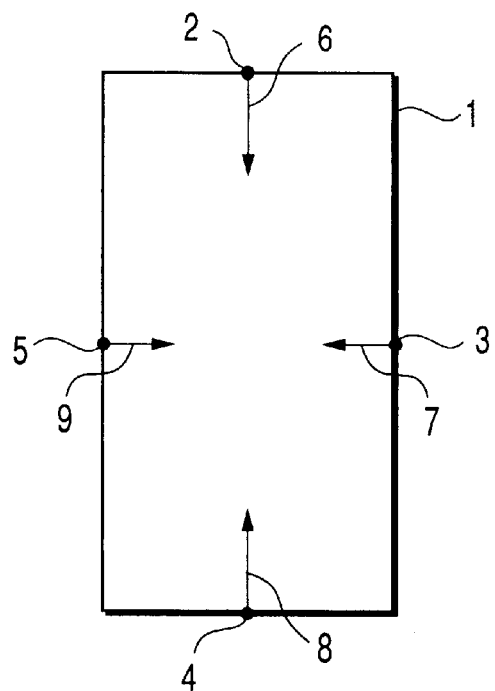
FIG. 3 shows a visualized CAD data pattern and critical location information.

First, a display monitor is used to concurrently display the CAD data for a pattern to be corrected and the critical location information obtained by the above-mentioned method of creating critical location information (step S11). FIG. 3 shows the visualized CAD data pattern and critical location information which are displayed on the display monitor.

In FIG. 3, reference numeral 1 indicates the visualized CAD data (square pattern). Reference numerals 2 to 5 indicate visualized coordinate information. Reference numerals 6 to 9 indicate visualized critical location information (arrows). Directions of arrows 6 to 9 correspond to size violation directions (thinning directions here) indicated by the simulation. Lengths of arrows 6 to 9 denote size violation magnitudes (thinning magnitudes here).

Based on the critical location obtained by the above-mentioned method of creating critical location information, a scanning electron microscope (SEM) is used to obtain an actual pattern image (SEM image) formed on a semiconductor wafer as an actual sample (step S12). The order of steps S11 and S12 may be reversed.

The SEM image is overlapped with the pattern (CAD pattern) corresponding to the above-mentioned CAD data so as to balance positions relative to adjacent patterns (step S13). A divergent distance between the CAD pattern and the SEM image is measured with respect to directions indicated by the critical location information at a location corresponding to each coordinate information (critical location). These directions indicate the size violation and correspond to horizontal and vertical directions here. Based on the divergent distance measured, it is determined whether there is a divergent distance exceeding the rated value, namely whether a critical location exists (step S14).

Figure 4:
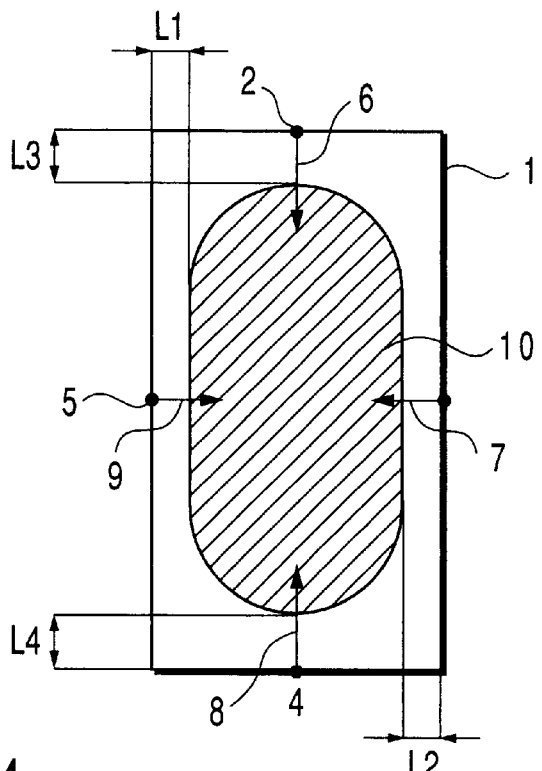
FIG. 4 shows an overlap of the visualized CAD data pattern and critical location information with an SEM image.

FIG. 4 shows an overlap of the visualized CAD data pattern and critical location information in FIG. 3 with an SEM image. In FIG. 4, reference numeral 10 denotes an SEM image. Reference numerals L1 and L2 denote horizontal divergent distances between the CAD pattern and the SEM image. Reference numerals L3 and L4 denote vertical divergent distances between the CAD pattern and the SEM image.

When there is a critical location, namely a pattern location with a divergent distance exceeding the rated value, this means that there is a pattern location with divergent distances exceeding lengths of the arrows 6 to 9 in FIG. 4. In this case, pattern sizes are reviewed for the CAD data corresponding to that pattern location and the mask data used for forming the actual pattern. Steps S11 to S14 are repeated until the divergent distances conform to the rated value, namely until the critical location is solved.

When the divergent distances conform to the rated value, namely when no critical location exits, the mask data used for forming the actual pattern is adopted (step S15) to complete the corrective measures. This embodiment applies the critical location information according to the present invention to corrective measures. The critical location information according to the present invention can be also used for the fixed point monitoring method and the critical location analysis method for patterns. Namely, the embodiment uses the critical location information according to the present invention instead of, or together with conventionally used information.

The present invention is not limited to the above-mentioned embodiment which has explained the critical location correction method for patterns with respect to thinning of a wiring pattern and the like. The present invention is also effective for the other patterns having critical locations which are pinpointed or analyzed with difficulty through the visual inspection. These patterns include a wiring pattern having partial thickening, a pattern having shortening, and the like.

The above-mentioned embodiment has explained display attributes by using the drawing size (arrow size) and the drawing direction (arrow direction), but is not limited to this combination. It may be preferable to use different display attributes selected from a group of display attributes comprising, say, a drawing size, direction, color, and shape. Specifically, there can be provided a method of visualizing the divergent distance by using an area of a drawing such as a rectangle and the divergent direction by using a drawing color.

Further, various inventions may be extracted by appropriate combinations of a plurality of constituent features disclosed in the above-mentioned embodiment. For example, when some constituent features are deleted from all constituent features indicated in the embodiment, it may be possible to solve the problems to be solved by the invention. In this case, it is possible to extract an invention comprising all the constituent features with some constituent features deleted. Furthermore, it is to be understood that modifications will be apparent to those skilled in the art without departing from the spirit of the present invention.

As has been previously described in detail, the present invention can provide the method of evaluating critical location information on a semiconductor apparatus pattern so as to easily pinpoint or analyze critical locations which are specified with difficulty through the visual inspection.

What is claimed is:

1. A critical location evaluation method for a semiconductor apparatus pattern, comprising:

comparing first pattern data corresponding to no critical location with second pattern data corresponding to a critical location with respect to said same semiconductor apparatus pattern;

extracting a difference between said first pattern data and said second pattern data as characteristic information indicating a characteristic of said critical location and coordinate information indicating a coordinate of said critical location, with respect to a location causing said difference;

visually displaying a first pattern corresponding to said first pattern data, said coordinate information about said critical location obtained from said extraction step, and said characteristic information indicating said characteristic of said critical location;

obtaining an actual pattern image by means of a microscope based n said coordinate information about said critical location;

overlapping said first pattern with said actual pattern image; and measuring a divergent distance between said first pattern and said actual pattern image at said critical location and determining whether the divergent distance satisfies a rated value.

2. The critical location evaluation method a cording to claim 1 wherein in visually displaying said first pattern, said coordinate information and said characteristic information, at least one of a deviation magnitude and a deviation direction is visually displayed as the characterization information.

3. The critical location evaluation method ac ording to claim 2, wherein said deviation magnitude is visually displayed according to a first display attribute, and said deviation direction is visually displayed according to a second display attribute.

4. The critical location evaluation method according to claim 3 wherein different attributes are selected from a display attribute group comprising a drawing size, direction, color, and shape, as said first and second display attributes.

5. The critical location evaluation method according to claim 3, wherein a mark magnitude is used as said first display attribute and a mark direction is used as said second display attribute.

6. The critical location evaluation method according to claim 3 wherein an arrow length is used as said first display attribute and an arrow direction is used as said second display attribute.

7. The critical location evaluation method a cording to claim 3 wherein CAD data corresponding to an ideal pattern is used as said first pattern data.

8. The critical location evaluation method for a semiconductor apparatus pattern according to claim 1, wherein said first pattern data is CAD data corresponding to an ideal pattern and said second pattern data is simulation data.

9. The critical location evaluation method for a semiconductor apparatus pattern according to claim 8, wherein said simulation data is obtained by inputting a simulation parameter to a simulator, specifying a pattern to be simulated, and performing a simulation.

* * * * *